United States Patent
Tinnemans et al.

(10) Patent No.: US 7,486,384 B2
(45) Date of Patent: Feb. 3, 2009

(54) LITHOGRAPHIC SUPPORT STRUCTURE

(75) Inventors: Patricius Aloysius Jacobus Tinnemans, Hapert (NL); Edwin Johan Buis, Belfeld (NL); Sjoerd Nicolaas Lambertus Donders, 'S-Hertogenbosch (NL); Jan Van Elp, Delft (NL); Jan Frederik Hoogkamp, Breda (NL); Aschwin Lodewijk Hendricus Johannes Van Meer, Roosendaal (NL); Patrick Johannes Cornelus Hendrik Smulders, Best (NL); Franciscus Andreas Cornelis Johannes Spanjers, Oirschot (NL); Johannes Petrus Martinus Bernardus Vermeulen, Valkenswaard (NL); Raimond Visser, Best (NL); Henricus Gerardus Tegenbosch, Eindhoven (NL); Johannes Charles Adrianus Van Den Berg, Eindhoven (NL); Henricus Johannes Adrianus Van De Sande, Geldrop (NL); Thijs Vervoort, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 119 days.

(21) Appl. No.: 10/813,687

(22) Filed: Mar. 31, 2004

(65) Prior Publication Data
US 2004/0246459 A1  Dec. 9, 2004

(30) Foreign Application Priority Data
Mar. 31, 2003 (EP) .................. 03075929
Jul. 23, 2003 (EP) .................. 03077320

(51) Int. Cl.
*G03B 27/58* (2006.01)
*G03B 27/62* (2006.01)

(52) U.S. Cl. ......................................... 355/72; 355/75
(58) Field of Classification Search .................. 355/53, 355/72–76; 361/234; 414/416.03, 744.5, 414/744.05
See application file for complete search history.

(56) References Cited

U.S. PATENT DOCUMENTS 4,620,738 A    11/1986  Schwartz et al. ........... 294/64.1

(Continued)

FOREIGN PATENT DOCUMENTS

EP    1 052 546 A1    11/2000

(Continued)

OTHER PUBLICATIONS

JPO Office Action (English language) mailed Jun. 1, 2007.

(Continued)

*Primary Examiner*—Hung Henry Nguyen
(74) *Attorney, Agent, or Firm*—Sterne, Kessler, Goldstein & Fox P.L.L.C.

(57) ABSTRACT

The present invention relates to a lithographic projection apparatus with a supporting structure to support and move an object, like a substrate. The supporting structure may be a robot having a robotic arm with a support frame for supporting, e.g. the substrate. The support frame includes a clamping structure having one or more clamps for holding the substrate during movement. The robot arm comprises one or more compliant parts. The clamp may be a Johnson-Raybeck effect type clamp with an oxidized upper surface. For better de-clamping, a RF AC decaying de-clamping voltage may be provided to the clamp. The apparatus may be cleaned with one single substrate only.

25 Claims, 6 Drawing Sheets

U.S. PATENT DOCUMENTS

| | | | |
|---|---|---|---|
| 4,692,836 A | 9/1987 | Suzuki | 361/234 |
| 4,788,577 A * | 11/1988 | Akiyama et al. | 355/53 |
| 5,133,635 A * | 7/1992 | Malin et al. | 414/744.8 |
| 5,229,872 A | 7/1993 | Mumola | |
| 5,296,891 A | 3/1994 | Vogt et al. | |
| 5,523,193 A | 6/1996 | Nelson | |
| 5,537,311 A | 7/1996 | Stevens | |
| 5,685,588 A | 11/1997 | Wong et al. | 294/64.1 |
| 5,880,924 A | 3/1999 | Kumar et al. | |
| 5,969,441 A | 10/1999 | Loopstra et al. | |
| 6,041,938 A | 3/2000 | Senn | |
| 6,068,668 A | 5/2000 | Mastroianni | |
| 6,155,773 A | 12/2000 | Ebbing et al. | |
| 6,184,972 B1 | 2/2001 | Mizutani et al. | |
| 6,242,879 B1 | 6/2001 | Sagues et al. | |
| 6,257,564 B1 | 7/2001 | Avneri et al. | 269/21 |
| 6,326,755 B1 * | 12/2001 | Babbs et al. | 318/568.21 |
| 6,404,483 B1 * | 6/2002 | Segers et al. | 355/53 |
| 6,559,928 B1 * | 5/2003 | Aoki | 355/72 |
| 6,577,382 B2 * | 6/2003 | Kida et al. | 355/77 |
| 6,631,062 B1 | 10/2003 | Minamisawa et al. | |
| 6,828,772 B1 * | 12/2004 | Hofer et al. | 324/158.1 |
| 2001/0011637 A1 | 8/2001 | Wytman | 205/124 |
| 2001/0020199 A1 | 9/2001 | Bacchi et al. | |
| 2002/0109954 A1 | 8/2002 | Tsuruta | |
| 2003/0005948 A1 | 1/2003 | Matsuno et al. | |

FOREIGN PATENT DOCUMENTS

| | | |
|---|---|---|
| JP | 55-103727 | 8/1980 |
| JP | 04-073928 | 3/1992 |
| JP | 05-006931 | 1/1993 |
| JP | 05-074689 | 3/1993 |
| JP | 07-321188 | 12/1995 |
| JP | 2001-024045 | 1/2001 |
| JP | 002-526925 | 8/2002 |
| TW | 380080 | 1/2000 |
| WO | WO 98/33096 A1 | 7/1998 |
| WO | W0 98/40791 A1 | 9/1998 |
| WO | WO 98/38597 A2 | 9/1998 |
| WO | WO 98/38597 A3 | 9/1998 |
| WO | EP 1 025 546 A2 | 11/2000 |

OTHER PUBLICATIONS

Australian Search Report issued for Singapore Patent Application No. SG 200401666-3, dated Feb. 14, 2006.

Peter van Zant, Microchip Fabrication: A Practical Guide to Semiconductor Processing, McGraw Hill Publishing Co., Third Edition, 1997, ISBN 0-07-067250-4.

Search Report for European Application No. 04076024.1 mailed Nov. 5, 2004, 6 pgs.

Search Report for European Application No. 03075929.4-2208 mailed Nov. 28, 2003, 4 pgs.

Ganesh et al., "Ultrasonic Senor-Based Motion Control for Robotic Manipulators" IEEE, Nov. 14, 1989, pp. 796-797, XP010091549.

* cited by examiner

LITHOGRAPHIC SUPPORT STRUCTURE

PRIORITY INFORMATION

This application claims priority from European Patent Application No. 03075929.4, filed Mar. 31, 2003, and European Patent Application No. 03077320.4, filed Jul. 23, 2003, both of which are herein incorporated by reference in their entirety.

BACKGROUND OF THE INVENTION

1. Field of the Invention

The present invention relates to a lithographic apparatus and, in particular, to a lithographic support structure for supporting and moving an object.

2. Description of the Related Art

Lithographic apparatus can be used, for example, in the manufacture of integrated circuits (ICs). In such a case, a patterning device may be used to generate a desired circuit pattern corresponding to an individual layer of the IC, and this pattern can be imaged onto a target portion (e.g. comprising one or more dies) on a substrate (silicon wafer) that has been coated with a layer of radiation-sensitive material (resist).

The term "patterning device" as here employed should be broadly interpreted as referring to means that can be used to endow an incoming radiation beam with a patterned cross-section, corresponding to a pattern that is to be created in a target portion of the substrate; the term "light valve" can also be used in this context. Generally, the said pattern will correspond to a particular functional layer in a device being created in the target portion, such as an integrated circuit or other device (see below). Examples of such patterning device include:

a mask: the concept of a mask is well known in lithography, and it includes mask types such as binary, alternating phase-shift, and attenuated phase-shift, as well as various hybrid mask types. Placement of such a mask in the radiation beam causes selective transmission (in the case of a transmission mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired;

a programmable mirror array: one example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as non-diffracted light. Using an appropriate filter, the said non-diffracted light can be filtered out of the reflected beam, leaving only the diffracted light behind; in this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuation mechanism. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means. In both of the situations described here above, the patterning device can comprise one or more programmable mirror arrays. More information on mirror arrays as here referred to can be gleaned, for example, from U.S. Pat. No. 5,296,891 and U.S. Pat. No. 5,523,193, and PCT patent applications WO 98/38597 and WO 98/33096, which are incorporated herein by reference. In the case of a programmable mirror array, the said support structure may be embodied as a frame or table, for example, which may be fixed or movable as required; and a programmable LCD array: an example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table; however, the general principles discussed in such instances should be seen in the broader context of the patterning device as set forth here above.

In a manufacturing process using a lithographic projection apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features.

This array of procedures is used as a basis to pattern an individual layer of a device, e.g. an IC. Such a patterned layer may then undergo various processes such as etching, ion-implantation (doping), metallization, oxidation, chemical-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens".

Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatus are described, for example, in U.S. Pat. No. 5,969,441 and WO 98/40791, both incorporated herein by reference.

In a lithographic apparatus, one or more actuators with grippers or clamping units, like robots, pre-aligners or substrate table pins will be used to hold and move objects from one location to another location. Those objects may be substrates, like wafers, but may also be other items.

For instance, substrates are typically introduced into a lithographic apparatus and finally placed on a substrate table. During this movement, the substrate may be handed over from a robot to a stationary position (or, optionally, to another robot). During hand-over, there may be a global tilt (for instance, 3 mrad) relative to a predetermined x-axis or y-axis, defined as Rx and Ry, respectively. This global tilt between these two items involved in a take-over should be minimized to ensure the proper working of a clamping device used by the robot to clamp, e.g., the substrate. Correct functioning of the clamping device is necessary to ensure positive handling, i.e., at every point in time, it should be clear where the substrate is in the lithographic apparatus. This implies that the substrate should be actively clamped at all times.

SUMMARY OF THE INVENTION

For these and other reasons, the principles of the present invention, as embodied and broadly described herein, provide for a lithographic support system having improved compensation of tilt and/or displacement between an object and a supporting structure, such as a robot arm. In one embodiment, the lithographic support system comprises a supporting structure configured to hold and move an object, the supporting structure comprising a clamping structure, and a compliant part configured to compensate for at least one of a tilt and displacement between the object and the clamping structure.

By the above-referred supporting structure, very accurate take-over is possible while no rotation or displacement of, e.g., a substrate is necessary. Forces created by a collision between, e.g., a substrate and a receiving supporting structure are absorbed by the compliant part. There will be less risk of displacement and of losing substrates in the lithographic apparatus.

The invention also relates to a supporting structure where the supporting structure is a robot arm. Moreover, the invention relates to a robot for use in a lithographic projection apparatus, comprising such a robot arm.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

BRIEF DESCRIPTION OF DRAWINGS

Embodiments of the invention will now be described, by way of example only, with reference to the accompanying schematic drawings in which corresponding reference symbols indicate corresponding parts, and in which:

FIG. 3b shows a side view of the arrangement according to FIG. 3a;

FIG. 6b shows an enlarged portion of the clamp of FIG. 6a;

DETAILED DESCRIPTION OF THE INVENTION

Lithographic Apparatus

Figure 1:
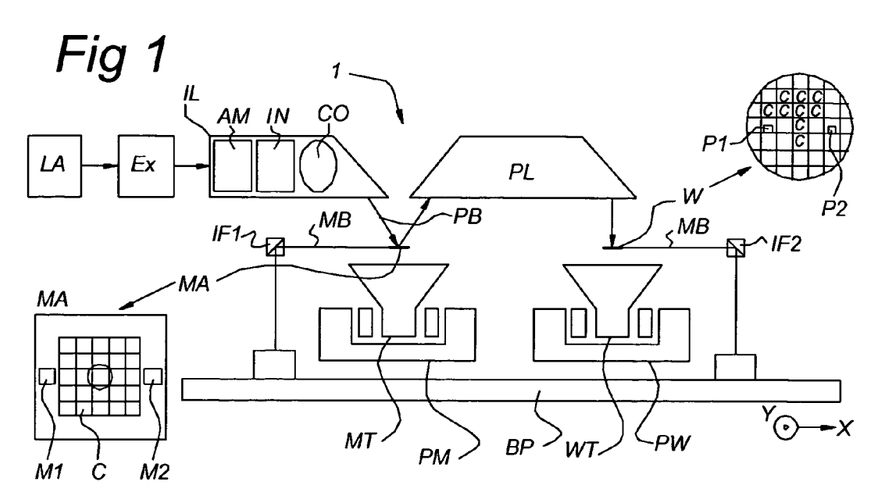
FIG. 1 depicts a lithographic projection apparatus according to an embodiment of the invention.

FIG. 1 schematically depicts a lithographic apparatus according to a particular embodiment of the invention. The apparatus comprises:

- a radiation system Ex, IL: for supplying a projection beam PB of radiation (e.g. UV radiation). In this particular case, the radiation system also comprises a radiation source LA;
- a first object table (mask table) MT: provided with a mask holder for holding a mask MA (e.g. a reticle), and connected to first positioning mechanism PM for accurately positioning the mask with respect to item PL;
- a second object table (substrate table) WT: provided with a substrate holder for holding a substrate W (e.g. a resist-coated silicon wafer), and connected to second positioning mechanism PW for accurately positioning the substrate with respect to item PL; and
- a projection system ("lens") PL: for imaging an irradiated portion of the mask MA onto a target portion C (e.g. comprising one or more dies) of the substrate W.

As here depicted, the apparatus is of a reflective type (i.e. has a reflective mask). However, in general, it may also be of a transmissive type, for example (with a transmissive mask). Alternatively, the apparatus may employ another kind of patterning device, such as a programmable mirror array of a type as referred to above.

The source LA (e.g. a mercury lamp or an excimer laser) produces a beam of radiation. This beam is fed into an illumination system (illuminator) IL, either directly or after having traversed conditioning mechanism, such as a beam expander Ex, for example. The illuminator IL may comprise adjusting mechanism AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors); this latter scenario is often the case when the source LA is an excimer laser. The current invention and Claims encompass both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning means (and interferometric measuring means IF), the substrate table WT can be moved accurately, e.g. so as to position different target portions C in the path of the beam PB. Similarly, the first positioning means can be used to accurately position the mask MA with respect to the path of the beam PB, e.g. after mechanical retrieval of the mask MA from a mask library, or during a scan. In general, movement of the object tables MT, WT will be realized with the aid of a long-stroke module (course positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed.

The depicted apparatus can be used in a variety of different modes:

step mode: the mask table MT and the substrate table WT are kept essentially stationary, while an entire pattern imparted to the projection beam is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure;

scan mode: the mask table MT and the substrate table WT are scanned synchronously while a pattern imparted to the projection beam is projected onto a target portion C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion; and other mode: the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
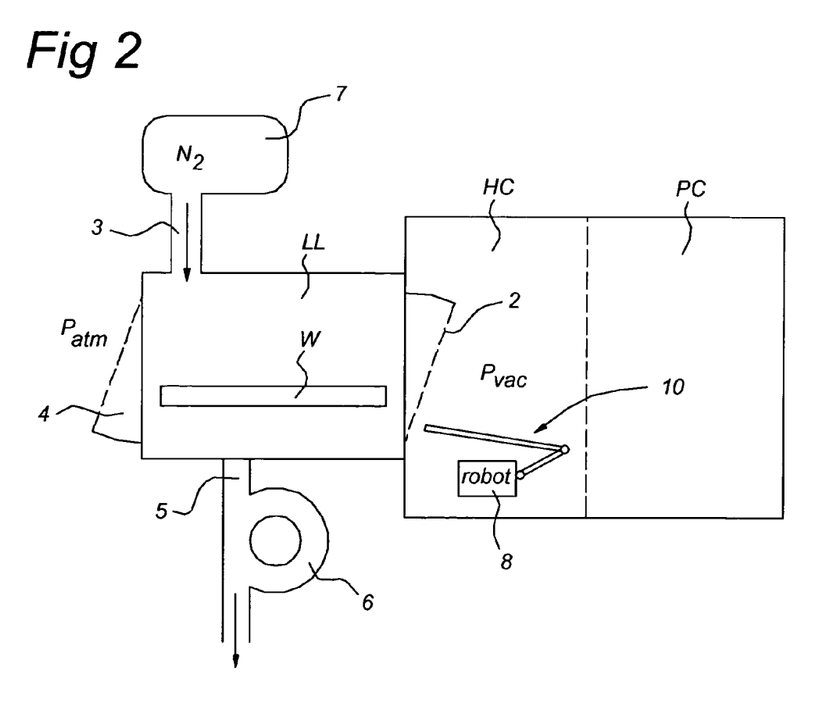
FIG. 2 schematically depicts a part of a lithographic apparatus in which the present invention can be used according to an embodiment of the invention.

FIG. 2 schematically depicts several parts of the lithographic apparatus through which, in operation, substrates (and possibly other objects) may be moved. FIG. 2 shows a load lock LL, a handling chamber HC and a projection chamber PC. The load lock LL comprises two doors 2, 4. The first door 2 faces the inside of the lithographic projection apparatus 1, comprising the handling chamber HC and the projection chamber PC, in which, in an embodiment, vacuum conditions, having a pressure $P_{vac}$, are maintained. The second door 4 faces, e.g., atmospheric conditions, having a pressure that is, for instance, equal to atmospheric pressure $P_{atm}$. However, the invention can also advantageously be applied for other pressure values.

The load lock LL comprises a wall that forms an inner space. The load lock LL is further provided with supporting means (not shown) for supporting one or more objects, such as a substrate (wafer) W, as will be known to a person skilled in the art.

As can be seen in FIG. 2, the load lock LL is also provided with a gas inlet 3 and a gas outlet 5. The gas outlet 5 can be provided with a pump 6 to pump down the load lock LL to vacuum conditions of, for instance, $10^{-3}$-$10^{-5}$ Pa, a pressure substantially equal to or lower than $P_{vac}$. The movement of, for instance, a substrate W from the atmospheric environment to the vacuum via the load lock LL, usually comprises the following steps:

opening the second door 4 facing the atmospheric conditions $P_{atm}$, transferring the substrate W from atmospheric conditions $P_{atm}$ into the load lock LL, closing the second door 4, depressurizing the load lock LL to a pressure substantially equal to or less than vacuum conditions $P_{vac}$ through gas outlet 5 using, for example, pump 6, opening the first door 4 facing the vacuum conditions $P_{vac}$, and transferring the substrate W to the vacuum conditions $P_{vac}$ from the load lock LL.

The gas inlet 3 can be used to vent the load lock in order to raise the pressure in the load lock from $P_{vac}$ to $P_{atm}$. Movement of a substrate W from the vacuum to the atmospheric environment via the load lock LL, usually comprises the following steps:

depressurizing the load lock LL to a pressure substantially equal to or less than the vacuum conditions $P_{vac}$, opening the first door 2 facing the vacuum conditions $P_{vac}$, transferring the substrate W from the vacuum conditions $P_{vac}$ into the load lock LL, closing the first door 2, venting the load lock LL to a pressure substantially equal to or more than atmospheric conditions $P_{atm}$ via the gas inlet 3, opening the second door 4 facing the atmospheric conditions $P_{atm}$, and delivering the substrate W to the atmospheric conditions $P_{atm}$.

These actions as listed above refer to atmospheric conditions outside the first door 2. However, as is known to persons skilled in the art there may be other pressure conditions outside the load lock. The example given above is by no means intended to restrict the use of the load lock LL. Hazardous particles and contaminating molecules, such as oxygen, hydrocarbons and/or $H_2O$ that may interfere with processes in the lithographic projection apparatus, are limited from entering the load lock LL by filling the load lock LL with a specially chosen gas that doesn't comprise these particles or molecules. Gasses, such as $N_2$ gas, Ar gas or synthetic air, but of course also other suitable gasses, can be used, as will be understood by a person skilled in the art.

When the load lock LL is brought back from $P_{vac}$ to $P_{atm}$ by supplying gas through gas inlet 3 to the load lock LL a special gas is typically used instead of normal environmental air. FIG. 2 shows a gas supply 7 comprising $N_2$ gas. Gas supply 7 may be a high pressure tank.

It will be appreciated by persons skilled in the art that for supporting and moving a substrate W, and possibly other objects in, towards, and from the lithographic apparatus 1 (like in a track, the load lock, a pre-aligner and the projection chamber), use is made of a supporting structure driven by an actuator to move the substrate W in either one, two or three dimensions, such as a robot 8 with an arm provided with a suitable gripper or clamp. Another example of a supporting structure is a combination of pins to displace, lift or lower a substrate in a direction, which are, optionally, provided with a clamp to hold the substrate In the embodiments described below, reference will be made to substrates, but the invention is equally applicable to other objects.

EMBODIMENT 1

Figure 3A:
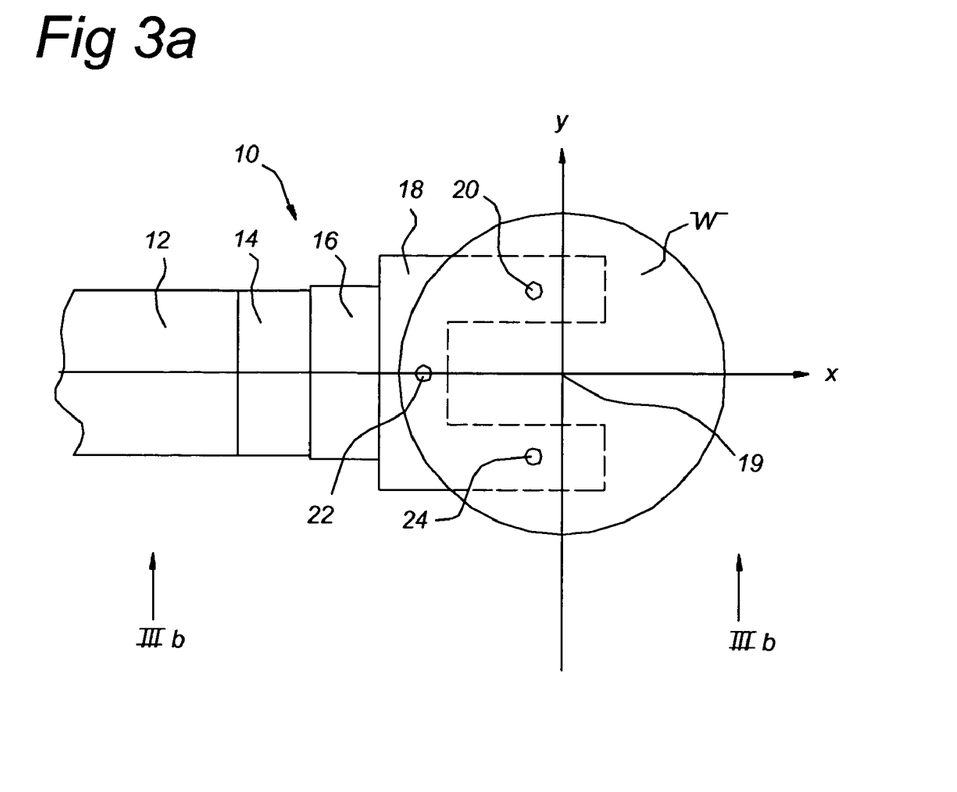
FIG. 3a schematically shows a robot arm supporting a substrate.

FIG. 3a shows a robot arm 10 of robot 8 in more detail. The robot arm 10 comprises a rod 12 connected to a support frame 18 by means of a compliant part 14 and an intermediate part 16.

As shown, the support frame 18 is provided with a clamping structure, indicated by three clamps 20, 22, and 24. The support frame 18 supports a substrate W. The substrate W can be held on the support frame 18 by means of the clamps 20, 22 and 24.

Figure 3B:
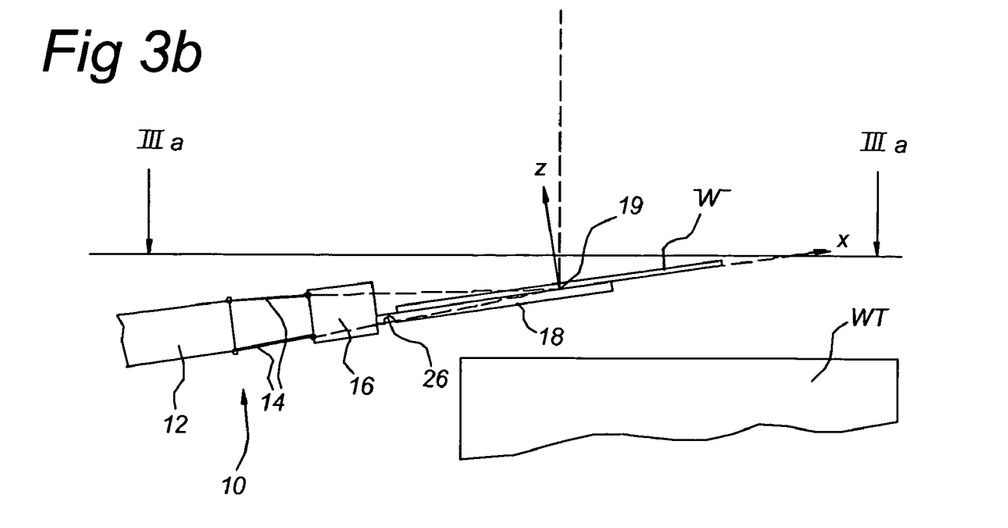

The support frame 18 defines a plane in which the substrate W lies when it is clamped by the clamps 20, 22, and 24. That plane is defined by an x-axis and an y-axis. The x-axis is in the longitudinal direction of the rod 12, whereas the y-axis is perpendicular to the x-axis. A z-axis is defined perpendicular to both the x-axis and the y-axis. The z-axis is not shown in FIG. 3a but is shown in FIG. 3b. The x-, y- and z-axes have an origin 19 that is defined to be the location where the center of the substrate W is to be substantially located during movement of the substrate W through the apparatus shown in FIG. 2.

FIG. 3b shows a side view of the arrangement shown in FIG. 3a. FIG. 3b, additionally, shows the substrate table WT (which is not shown in FIG. 3a). Moreover, FIG. 3b shows that support frame 18 may be provided with a compliant portion (or flexible portion) 26. The compliant portion 26 may be located behind the "fingers" of support frame 18 but may also be located within one or both of the "fingers".

As shown in FIG. 3b, the compliant portion 14 may comprise two or more compliant rods 14, rotatable at their ends. Thus, the intermediate part 16 is able to rotate slightly about both the x-axis and the y-axis. Moreover, it can be lifted slightly in the z-direction. Of course, the compliant portion 14 can be made of any other structure or of any material, having a flexible or compliant feature.

As shown in FIG. 3b, the compliant portion 26 of the support frame 18 is produced by providing the support frame 18 with a notch, such that the front side of the support frame designed to hold the substrate W is allowed to rotate about both the x-axis and the y-axis, and to lift slightly in the z-direction, without any movement of the rod 12.

Preferably, the compliant portion 14 is designed such that it has rotation poles in a predetermined center coinciding with the center of the coordinate system, as defined by the x-, y- and z-axes. This point of origin is also the location where the center of the substrate W is to be located during gripping/clamping by the robot arm. Thus, any rotation errors in a positive and negative direction of the substrate W about the x- and/or y-axis (generally a tilt) can be adapted best.

By providing the robot arm 10 with at least one of the compliant parts 14, 26, a tilt and/or a displacement in z between the substrate W and another part in the lithographic apparatus can be compensated. This is, for instance, significant during substrate hand-over from a substrate handler robot to the substrate table WT and from a pre-aligner to a substrate handler robot. However, this also holds for other hand-overs in the apparatus. It is especially important for the hand-over to a device provided with clamps to hold, e.g., the substrate W. If the tilt and/or a displacement in z between the substrate W and the part to receive the substrate W is too large, the hand-over cannot take place because the clamps may not function. By providing the compliant parts 14 or 26, small tolerances are introduced enabling, in this case, the substrate W to adapt its tilt and/or a z-displacement to the other receiving part under a small force.

European Patent Application 03075929.4 of the present applicant, from which the priority is claimed and which is incorporated herein in its entirety, discloses that a compliant mechanism is also provided between the gripper and the armset (as described in EP 03075929.4), to decouple the movements of the gripper with respect to the armset. As a result of the mechanical link, the accuracy of the position of the gripper, and thus the substrate, with respect to the receiver is increased. Also, vibrations, and in particular the relative vibrations of the gripper and the receiver are reduced and the mutual accuracy of the substrate and the receiver can be increased. Of course, the mechanical docking solution can also be used for the reverse procedure, i.e. picking up objects, as for instance a substrate, from the receiver.

Figure 4A:
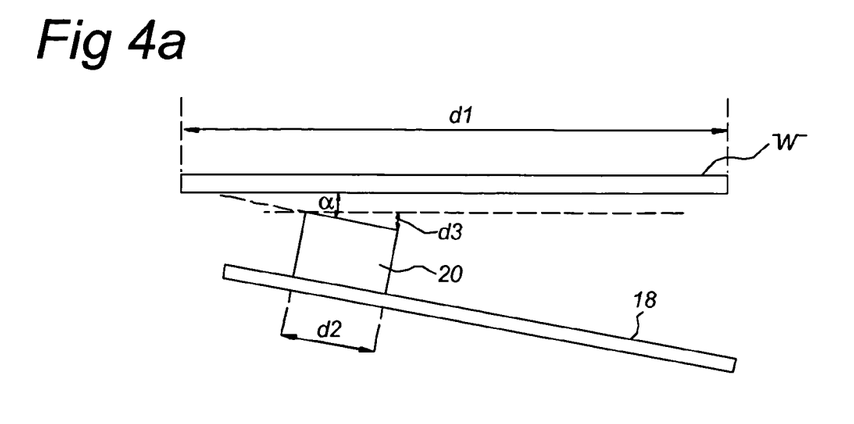
FIG. 4a shows a side view of a support frame of a robot arm with a clamp to hold a substrate according to an embodiment of the invention.
Figure 4B:
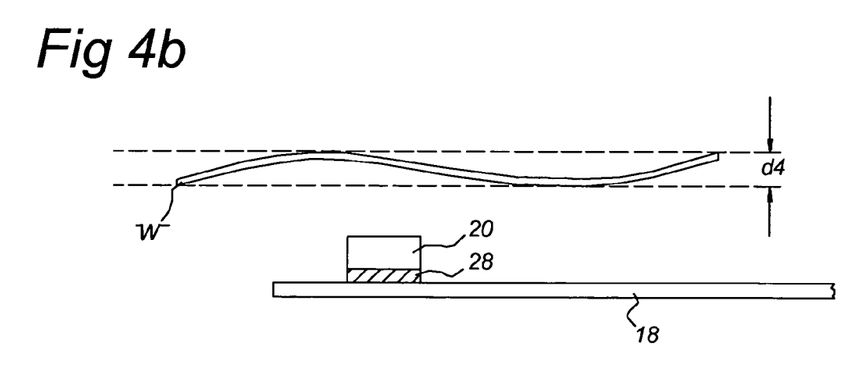
FIG. 4b shows a side view of a support frame of a robot arm with a clamp to hold a substrate according to an embodiment of the invention, wherein the substrate is warped.

FIGS. 4a and 4b show that the provision of compliant parts within a clamp may also help correcting for tilt and displacements when clamping a substrate W (or any other object) to a clamp on a support frame 18 of a robot arm.

FIG. 4a shows the support frame 18 provided with the clamp 20, approaching a substrate W to be clamped. There is a tilt angle α between the top of the clamp 20 and the substrate W. The substrate W has a diameter D1 that may be 200 mm. The clamp 20 has a diameter D2 that may be 40 mm. In an example, for a proper clamp functioning, the tilt angle α requirements can be so low that the distance indicated by D3 in FIG. 4a needs to be below 8 micrometers. The clamping device may be a vacuum pad or an electrostatic clamp, like a Johnson-Raybeck effect clamp. As is known to persons skilled in the art, tilt requirements are more stringent for the electrostatic clamps.

FIG. 4b shows that the substrate W may not be perfectly flat in a plane but may, e.g., be undulated when viewed in cross-section. The undulation amplitude D4 may be as large as 500 micrometer. This undulation may be the result of all kinds of process steps during the lithography process, as is known to persons skilled in the art. Due to the undulated cross-section of the substrate W, the stringent tilt requirements may not be met at all locations of the substrate W.

To compensate then for a tilt and/or displacement between the substrate and the clamp, the clamp 20 may be provided with a compliant portion 28 as shown in FIG. 4b. This compliant portion 28 may be made of a metal flexure or any other flexible material or structure suitable for a lithographic projection apparatus. The compliant portion 28 provides the clamp with Rx, Ry, and z compliance. Either the weight of the substrate W or a small positive force in the z-direction used during hand-over of the substrate W may, then, ensure that the surface of the clamp will align with the rear surface of the substrate W. When aligned, the clamp 20 will hold the rear surface of the substrate W. The clamp force will then be sufficient to keep the substrate W clamped during movement through the apparatus. The clamp compliance can be made such that the substrate's x, y and Rz position are not changed. This maintains positional accuracy of the substrate, as is required for other processes in the lithographic projection apparatus.

Preferably, the weight of the substrate W is sufficient to align the clamp since the clamp should also work after losing clamp force due to, e.g., cut off of electrical power, after an emergency stop of the apparatus, etc. As may be evident to a person skilled in the art, the compliant portion 28 can also correct for any curvature of the support frame 18.

Figure 4C:
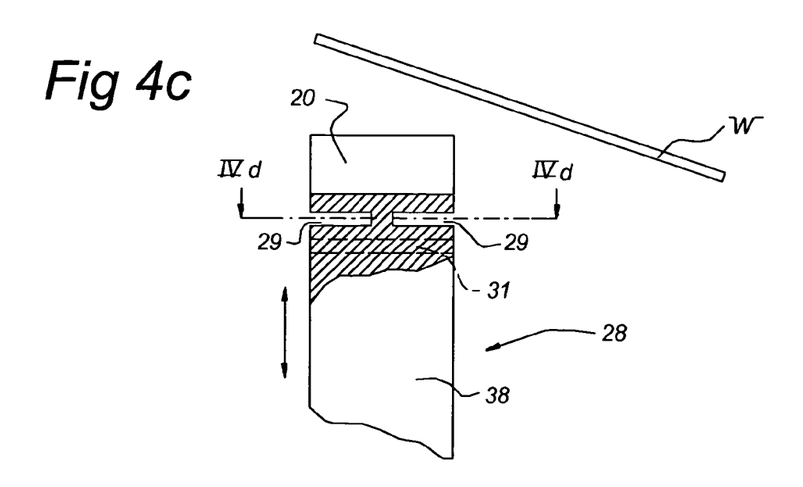
FIG. 4c shows a cross section of a supporting structure in the form of a moveable rod with a compliant part according to an embodiment of the invention.
Figure 4D:
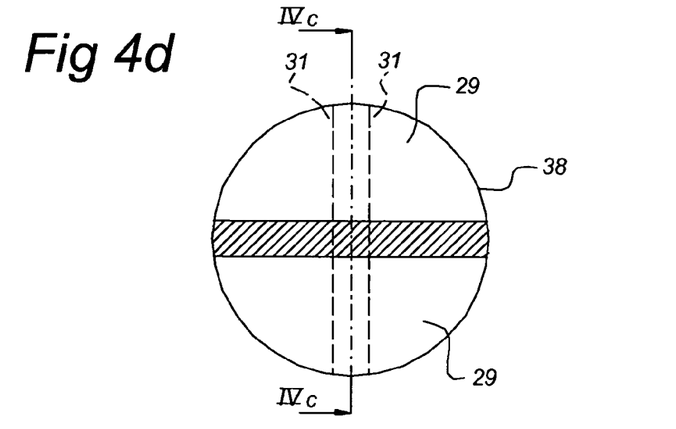
FIG. 4d shows a cross section of the rod of FIG. 4c.

FIGS. 4c and 4d show the provision of compliant portions with supporting structures that are allowed to move in one direction only. The supporting structure shown comprises a rod like a substrate table pin 38 having a clamp 20 mounted on an end. The pin 38 comprises compliant portion 28. The compliant portion 28 is made by providing the pin with two notches 29 that provide the pin 38 with a flexibility in a first direction perpendicular to its direction of movement. There may be provided two other notches 31, as indicated with dashed lines, in the pin 38 perpendicular to the notches 29 to provide the pin 38 with a flexibility in a second direction perpendicular to the first direction.

FIG. 4d shows a cross section of the pin of FIG. 4c in the direction of IVd-IVd, as shown in FIG. 4c to better show the notches 29 and optional notches 31.

Of course, other compliant parts than the one shown in FIGS. 4c and 4d can be used. The rod 38 may a cross section different from the circular one shown.

Figure 4E:
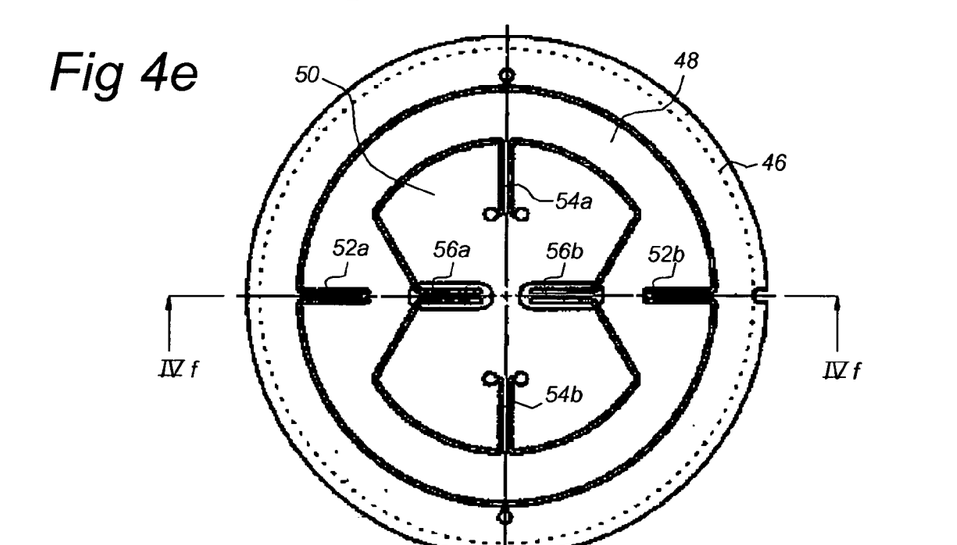
FIGS. 4e and 4f show a further embodiment of a flexible supporting structure.
Figure 4F:
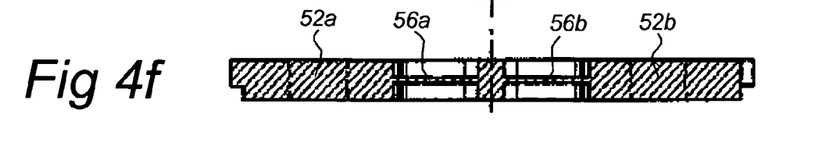

A further embodiment of a flexible supporting structure to be used with, e.g., an electrostatic clamp for clamping, e.g., a wafer or a reticle, is shown in FIGS. 4e and 4f.

The supporting structure shown comprises an outer ring 46, an interface ring 48 and a central part 50. The outer ring 46 will be fixed in a gripper (not shown) or a stage (not shown). On top of the central part 50, an electrostatic clamp (not shown) will be attached, e.g., by gluing. In the outer ring 46, the interface ring 48 is fixed with two leaf springs 52a and 52b releasing the y, Rx and Rz d.o.f.'s (=degrees of freedom). The central part 50 on its turn is fixed to the interface ring 48 by two leaf springs 54a, 54b and two rods 56a, 56b. The leaf springs 54a, 54b are oriented to block the Rx d.o.f. Thus, together with the rods 56a, 56b the arrangement is such that the interface ring with respect to the central part 50 releases only one rotation, i.e., Ry. Two remaining translations are fixed with the flexible supporting structure of FIGS. 4e and 4f, i.e., x and z d.o.f.'s.

EMBODIMENT 2

Figure 5:
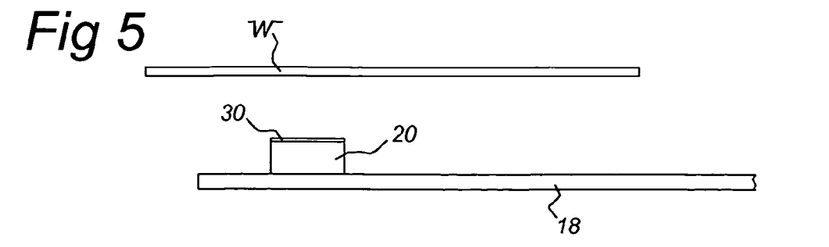
FIG. 5 shows a side view of a support frame of a robot arm with a clamp to hold a substrate, the clamp being provided with an oxidized upper surface according to an embodiment of the invention.

FIG. 5 shows a further embodiment of the invention, in which the clamp 20 on the support frame 18 is a Johnson-Raybeck effect type clamp. As known to persons skilled in the art, a Johnson-Raybeck effect type clamp is provided with a dielectric material made from a very low conductive material. Due to the very low conductivity (of electrical resistance) of the dielectric material, electrical clamping charges migrate through the dielectric material towards the clamping surface. In use, contact with substrate W is only made at some tiny spots. Between those tiny spots there are "open" spaces defining a distance between the clamping surface and the rear side of substrate W. Charges opposite the "open" spaces in both the clamping surface and the substrate W create a clamp with a very small distance between the charges, only the remaining gap, and hence create very large clamping forces.

In a Johnson-Raybeck clamp a small electrical current is flowing through the dielectric layer (furthermore in this example a small current flows in between the wafer and the dielectric material), which leads to a relatively small heat load of the combined clamp substrate system. For most applications this is not a problem because of the absence of lithography requirements like overlay and critical dimensions. For a clamp to be used in a lithography tool this can be a problem.

A solution to that problem according to an embodiment of the invention is to provide the upper surface of the clamp 20 a high electrical resistance coating (for example a thin dielectric layer of several (1-20) microns) such as an oxidized layer 30 (for example SiO2), as shown in FIG. 5. This oxidized layer 30 may be provided to the clamp 20 in any way known to persons skilled in the art. By providing the clamp 20 with the oxidized layer 30, only a very small electrical current will flow in the contact area between the clamp and the substrate and into the substrate W itself, thus having a negligible impact on the temperature of the substrate W.

EMBODIMENT 3

Figure 6A:
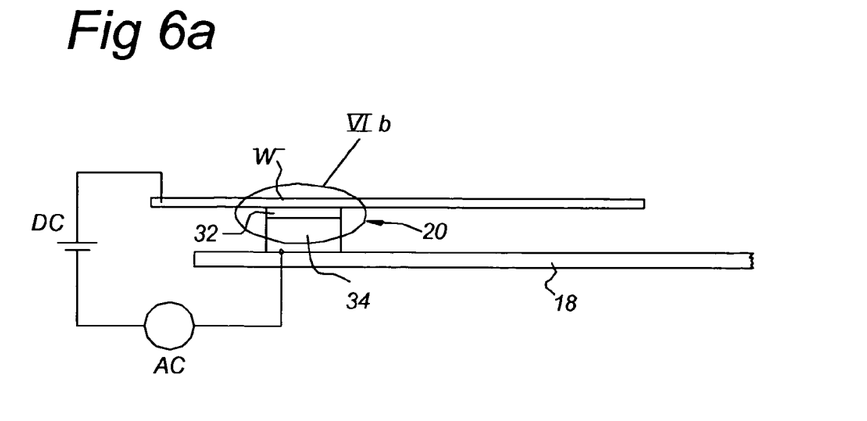
FIG. 6a shows a side view of a support frame with a clamp to hold a substrate, the clamp being a Johnson-Raybeck type clamp according to an embodiment of the invention.

FIG. 6a shows the support frame 18 provided with the clamp 20, the clamp 20 being a Johnson-Raybeck effect clamp. The clamp 20 holds the substrate W. The clamping effect is generated by a controller, shown as a series connection of a DC voltage source and an AC voltage source. As will be appreciated by a person skilled in the art, the controller may be based on any suitable electronic circuit or may be implemented by a computer.

Figure 6B:
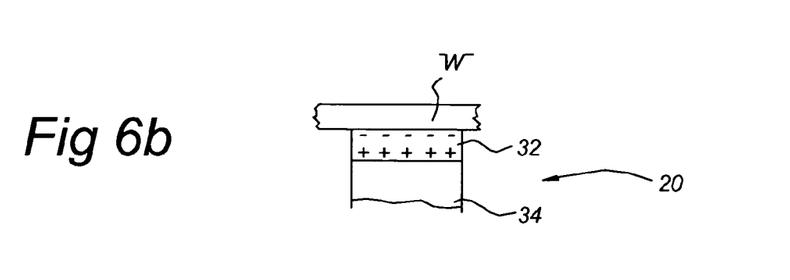

FIG. 6b shows a portion of FIG. 6a on an enlarged scale. FIG. 6b shows that the Johnson-Raybeck effect type clamp 20 is provided with a conductive part 34 and a electrically leaky insulator 32. Due to the leaky insulator 32, an electrical current will flow between the conductor part 34 and the substrate W resulting in trapped charges in the leaky insulator 32.

For clamping the substrate W to the clamp 20, only the DC source is switched on and the AC source is switched off. To de-clamp the substrate W from the clamp 20, one can simply switch off the DC source. However, due to the trapped charges in the leaky insulator 32, it will take a while before the attracting force between the clamp 20 and the substrate W is small enough to remove the substrate W. This is due to the trapped charges in the leaky insulator 32 only leaking away from the leaky insulator 32 very slowly.

It is known to solve this problem by applying one or more reverse-polarity voltage steps, opposite of the clamping potential provided by the DC source.

Figure 7:
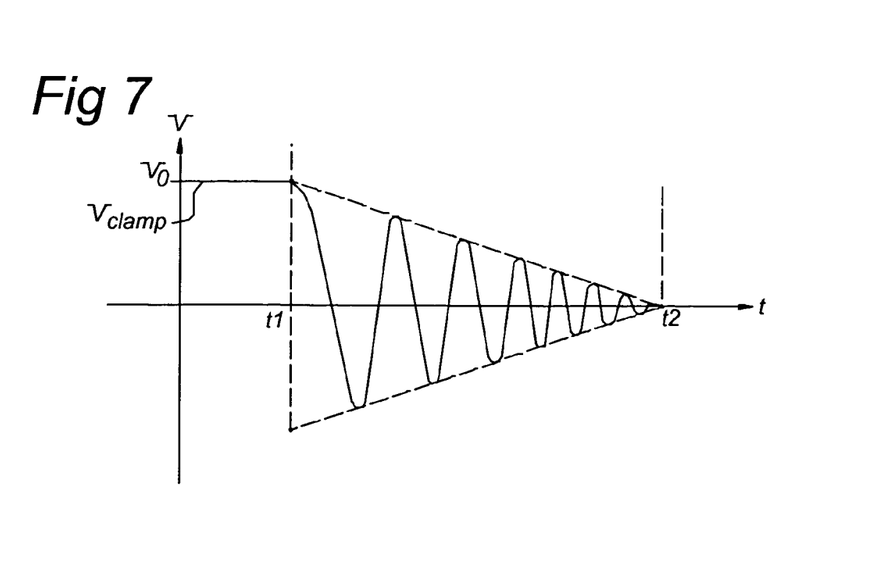
FIG. 7 shows a de-clamping voltage provided to a Johnson-Raybeck type clamp in accordance with an embodiment of the invention.

However, an alternative solution is for the AC source to be is arranged to provide a decaying AC voltage from the time that de-clamping starts. This is further explained in FIG. 7. FIG. 7 shows that the clamping voltage $V_{clamp}$ has a predetermined value $V_0$ at the time of clamping. At time $t_1$, the substrate W is to be de-clamped from the clamp 20. Then, at time $t_1$, the DC source is switched off and the AC source is switched on such that an AC voltage with decaying amplitude is provided to the clamp 20 until the amplitude of the AC voltage is substantially zero at time $t_2$. Preferably, the frequency of the AC source is a radio frequency. At time $t_2$, the clamping force of the clamp 20 is so small that the substrate W can be safely removed from the clamp 20.

EMBODIMENT 4

Figure 8:
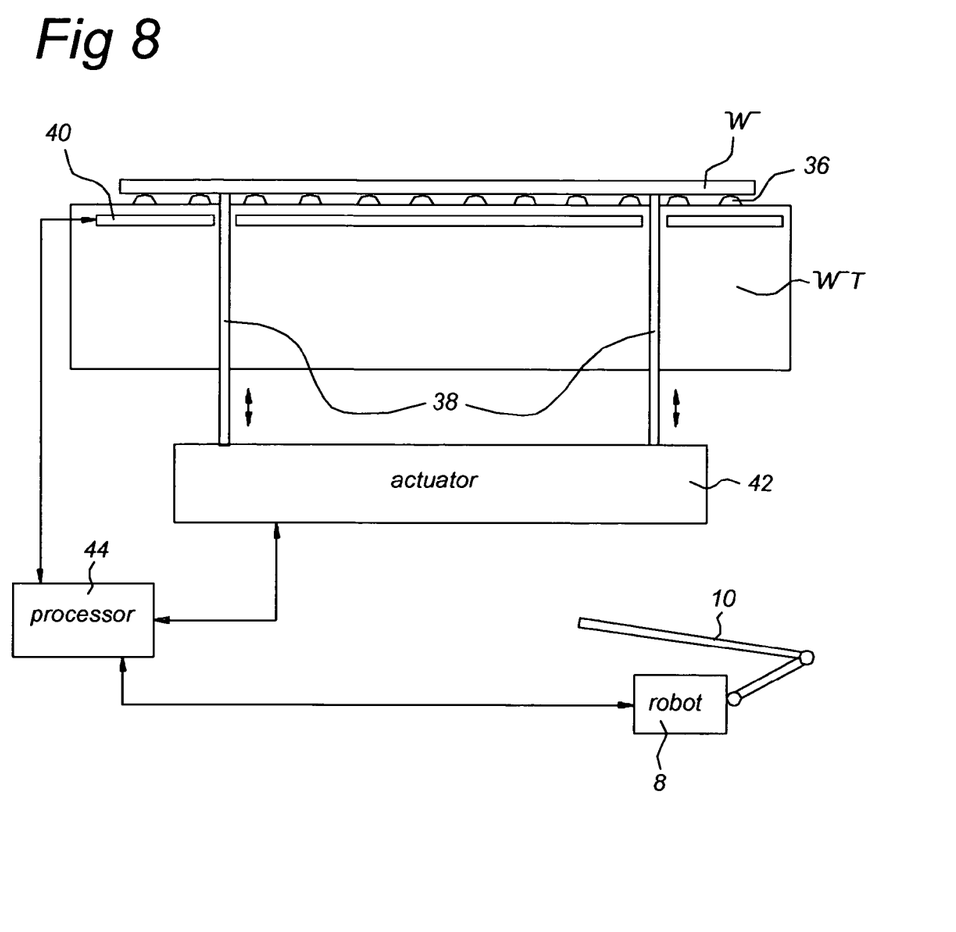
FIG. 8 shows a substrate table with an actuator to lift and lower a substrate from and towards the substrate table according to an embodiment of the invention.

FIG. 8 shows the substrate table WT with a substrate W. The lithographic apparatus is provided with an actuator 42 provided with pins 38. In use, the actuator 42 is arranged to displace the substrate W from and towards the substrate table WT. The substrate table WT is provided with a substrate support 36 (such as pimples) for supporting the substrate W. By providing the substrate table WT with the substrate support 36, the actual surface of contact between the substrate table WT and the substrate W is reduced while still providing a proper support.

The substrate table WT is provided with a clamp 40, e.g., an electrostatic clamp or vacuum clamp. However, other types of clamps may be used as well, as is known to persons skilled in the art.

A processor 44 is provided that is connected to both the clamp 40 and the actuator 42, in order to provide them with suitable control signals.

The robot 8 with its robot arm 10 is shown again, together with its connection to the processor 44, such that the processor 44 can also control the operation of the robot 8.

Sometimes, substrate cycling is part of a substrate table cleaning procedure. After a chemical and/or mechanical cleaning part of this procedure, typically about 8 substrates are cycled successively onto the substrate table to remove remaining contaminants from the substrate support 36 and to reach a substrate rear side contamination specification again.

However, there are at least two problems related to this current cleaning procedure:
1. availability and cost of the required number (8) of clean substrates at customer locations for substrate cycling;
2. downtime of the apparatus because of cycling cleaning substrates.

In accordance with an embodiment of the invention, the number of substrates needed for substrate cycling is drastically reduced to one single substrate. To that end, the processor 44 is arranged to control the clamp 40, the actuator 42 and the robot 8 in the following way:
   introducing the substrate W in the lithographic projection apparatus by means of the robot 8;
   clamping the substrate W to the substrate table WT by means of the clamp 40, such that the substrate W contacts the substrate table WT at a first location;
   de-clamping the substrate W from the substrate table WT by providing a de-clamping voltage to the clamp 40;
   repeating the clamping and de-clamping a predetermined number of times, such that the substrate contacts the substrate table WT repeatedly, either at a first location or at other locations than the first location.

In order to be sure that successive other locations of contacts with the substrate are arranged by which contamination will be removed from the substrate support 36, preferably, the actuator 42 is arranged to displace the substrate W from the substrate support 36 after de-clamping, to have the robot 8 rotate or shift the substrate W, to displace the substrate W to the substrate support 36 to clamp the substrate W by the clamp 40 again, etc. This may be repeated, e.g., 8 times.

By programming the processor 44 for this proposed method, the cleaning procedure may be much faster than in the past. Moreover, only one substrate is necessary for such a cleaning procedure. Thus, several portions of the rear surface of the substrate W are used to remove contamination on the substrate support 36; thus, saving the number of substrates necessary to perform the cleaning procedure.

While specific embodiments of the invention have been described above, it will be appreciated that the invention may be practiced otherwise than as described. For instance, it will be understood that the number of robots may be more than the single robot 8 shown in the figures. Moreover, there may be more load locks than the single load lock shown. Moreover, although a single processor 44 is shown (FIG. 8), there may be more than one processor to control different components of the apparatus. These processors may be connected to one another and arranged to co-operate, e.g., in a master slave arrangement.

Thus, the description is not intended to limit the invention and the configuration, operation, and behavior of the present invention has been described with the understanding that modifications and variations of the embodiments are possible, given the level of detail present herein. Accordingly, the preceding detailed description is not meant or intended to, in any way, limit the invention—rather the scope of the invention is defined by the appended claims.

What is claimed is:

1. A lithographic support system, comprising:
   a moveable support structure configured to support and move an object, said support structure comprising a robot arm having a rod coupled to a support frame that is provided with a clamp that clamps the object; and
   a flexible compliant structure configured to absorb a force created by a collision between said object and said clamp, the flexible compliant structure being provided at least between the rod and the support frame.

2. The lithographic support system of claim 1, wherein said flexible compliant structure comprises two or more compliant rods that are rotatable at their ends.

3. The lithographic support system of claim 1, wherein said flexible compliant structure comprises a notch such that a front portion of the support frame is enabled to rotate.

4. The lithographic support system of claim 1, further comprising a second flexible compliant structure provided on said clamp.

5. The lithographic support system of claim 1, wherein said support frame is in a plane defined by a x-axis, a y-axis, and a z-axis being perpendicular to said x-axis and said y-axis, said flexible compliant structure providing a compliance in at least one of a first rotation about said x-axis, a second rotation about said y-axis, and a z-direction parallel to said z-axis.

6. The lithographic support system of claim 1, wherein said flexible compliant structure is arranged such that said support frame is allowed to rotate about a predetermined center of rotation.

7. The lithographic support system of claim 1, wherein said object comprises a substrate.

8. The lithographic support system of claim 1, wherein said flexible compliant structure comprises a metal flexure.

9. The lithographic support system of claim 1, wherein the clamp is in contact with the object.

10. The lithographic support system of claim 1, wherein the flexible compliant structure is arranged at least between the rod and the support frame so as to be in a contactless relationship with the object.

11. The lithographic support system of claim 1, wherein the flexible compliant structure is configured to absorb a force created by a collision between the object and the clamp during transport of the object between a first and a second support, the first and the second support configured to support the object.

12. The lithographic support system of claim 1, wherein the flexible compliant structure includes a flexible material.

13. The lithographic support system of claim 1, wherein the flexible compliant structure includes at least one pair of leaf springs configured to provide a compliance in at least three degrees of freedom.

14. A lithographic robot, comprising:
a robotic arm configured to hold and move an object, the robotic arm having a rod coupled to a support frame that is provided with a clamp; and
a flexible compliant structure configured to absorb a force created by a collision between said object and said robotic arm, the flexible compliant structure being provided at least between the rod and the support frame.

15. The lithographic robot of claim 14, wherein said flexible compliant structure comprises two or more flexible compliant rods that are rotatable at their ends.

16. The lithographic robot of claim 15, wherein said flexible compliant structure comprises a notch such that a front portion of the support frame is enabled to rotate.

17. The lithographic robot of claim 14, wherein the flexible compliant structure includes a flexible material.

18. A lithographic apparatus, comprising:
a radiation system configured to provide a beam of radiation;
a support structure configured to support a patterning device that imparts a desired pattern onto said beam of radiation;
a substrate holder configured to hold a substrate;
a projection system configured to project said patterned beam onto a target portion of said substrate; and
a support system that holds and moves one of said substrate, said patterning device, and an object, in which said support system comprises:
a support frame provided with a clamp;
a rod coupled to the support frame; and
a flexible compliant structure configured to absorb a force created by a collision between said substrate, said patterning device, or said object and said clamp, the flexible compliant structure being provided at least between the rod and the support frame.

19. The lithographic apparatus of claim 18, wherein the flexible compliant structure includes a flexible material.

20. A device manufacturing method, comprising:
providing a substrate via a support system, said supporting system comprising a rod coupled to a support frame that is provided with a clamp structure that clamps said substrate, said supporting system configured to hold and move said substrate and absorb a force created by a collision between said substrate and said clamping structure by employing a flexible compliant structure provided at least between the rod and the support frame;
providing a beam of radiation using a radiation system;
imparting a desired pattern onto said beam of radiation by a patterning device; and
projecting said patterned beam of radiation onto a target portion of said substrate via a projection system.

21. The device manufacturing method of claim 20, wherein the flexible compliant structure includes a flexible material.

22. A lithographic support system, comprising:
a moveable support structure configured to support and move an object, the support structure comprising a robot arm having a rod coupled to a support frame that includes a clamp configured to clamp the object; and
a flexible compliant structure configured to absorb a force created by a collision between the object and the clamp during transport of the object between a first and a second support, the first and the second support configured to support the object, the flexible compliant structure provided on the rod or the support frame so as to be in a contactless relationship with the object.

23. The lithographic support system of claim 22, wherein the clamp is in contact with the object.

24. The lithographic support system of claim 22, wherein the flexible compliant structure includes a flexible material.

25. A lithographic support system comprising:
a moveable supporting structure configured to move and support an object, the moveable supporting structure including a rod having a clamp mounted on one end of the rod and a compliant portion, the compliant portion provided by at least two notches in the cross section of the rod, the compliant portion providing compliance in one degree of freedom.

* * * * *